United States Patent [19]

Zahn

[11] Patent Number: 4,515,001
[45] Date of Patent: May 7, 1985

[54] VARIABLE RADIUS LEAD FORMER

[75] Inventor: Robert L. Zahn, Millersville, Md.

[73] Assignee: The United States of America as represented by the Secretary of the Air Force, Washington, D.C.

[21] Appl. No.: 566,352

[22] Filed: Dec. 28, 1983

[51] Int. Cl.³ .............................................. B21F 1/00
[52] U.S. Cl. ...................................... 72/323; 72/305; 72/295; 140/105
[58] Field of Search ................... 140/105; 72/323, 322, 72/321, 7, 305, 316, 295; 29/566.3, 566.4, 564.1

[56] References Cited

U.S. PATENT DOCUMENTS

| | | | |
|---|---|---|---|
| 3,289,446 | 12/1966 | Davey | 72/36 |
| 3,401,548 | 9/1968 | Ross et al. | 72/389 |
| 3,416,348 | 12/1968 | Carter et al. | 72/220 |
| 3,556,166 | 1/1971 | Whitney | 140/105 |
| 3,646,659 | 3/1972 | Ragard | 29/203 B |
| 3,693,229 | 9/1972 | Daebler | 29/203 B |
| 3,796,201 | 3/1974 | Golub | 140/105 |
| 3,815,393 | 6/1974 | Daniels | 72/7 |
| 3,907,008 | 9/1975 | Bates et al. | 140/105 |
| 4,327,484 | 5/1982 | Asai et al. | 29/741 |
| 4,356,619 | 11/1982 | Snyder et al. | 29/566.3 |

FOREIGN PATENT DOCUMENTS 1940567 2/1970 Fed. Rep. of Germany ........ 29/203

OTHER PUBLICATIONS

Harris, *Axial Lead Component Formation*, Jan. 1976, pp. 2493, 2494.

Primary Examiner—Francis S. Husar
Assistant Examiner—Linda McLaughlin
Attorney, Agent, or Firm—Donald J. Singer; Stanton E. Collier

[57] ABSTRACT

A variable radius lead former operates an axial lead electronic component wherein the bend radius may be adjusted to any desired radius within specifications.

2 Claims, 6 Drawing Figures

TOP VIEW

VARIABLE RADIUS LEAD FORMER

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to devices for bending leads of electrical components according to specific requirements to fit into printed circuit boards, and, more particularly, relates to a device able to bend leads to different radii requirements and distances from the electrical component body.

The numerous small components used in electrical circuits and especially with printed circuits have become standardized in form insofar as possible. Two-wire components, such as resistors, capacitors and diodes are formed as small cylindrical members having an axially extended lead wire at each end. All are similar in appearance and are identified only by color coding and like markings Such components are ideal for mounting upon printed circuit boards. These boards are provided with spaced-apart mounting holes which are usually reinforced with eyelets. Thus, the circuit leads printed upon the board are connected with the lead wires of the components attached to the board by the simple operation of inserting the wires through the eyelets and soldering them into place.

In order to prepare a component for a printed circuit board, the opposing lead wires must be bent so that each wire will fit into its selected mounting hole. It is thus necessary to bend the lead wire ends so they will lie in parallelism transversely to the component and be spaced apart to fit the proper mounting hole in the circuit board. After the wires are inserted into the mounting holes, the component is spaced from the board, and the lead wires are soldered into place. Then the lag ends of the wire are cut off at the opposite surface of the board. This presents a neat-appearing arrangement of components which are securely held in position upon the board.

SUMMARY OF THE INVENTION

The present invention sets forth a variable radius lead former.

The three primary elements of the invention that come into contact with the electrical component are two dies, two clamps, and two punches. There are also means to move the electrical component and the above primary elements to form the leads in the desired shape. The former has a left and right half which are mirror images of each other. Each half has a die, punch, and clamp.

The die has a base, a pedestal attached to the base, and a contact anvil attached to the pedestal. The contact anvil has a contact surface defined by a quartered frustum. The anvil is mounted perpendicular to the vertical pedestal. The electrical component's lead is positioned perpendicular to the frustum on the anvil and is bent over the frustum at a defined position to produce a lead with a given radius bend. The clamp holds the lead on the top of the anvil while the punch bends the lead over the anvil contact surface.

If resistors are the electrical components, the resistors could be attached to a ribbon that moves and stops when the resistor is in the proper position for lead bending.

It is therefore one object of the present invention to provide for a variable radius lead former.

It is another object of the present invention to provide for a lead former that can be used in an automatic and programmable process.

It is another object of the present invention to provide for a lead former having a die with a quartered frustum shaped anvil.

These and many other objects and advantages of the present invention will be readily apparent to one skilled in the pertinent art from the following detailed description of a preferred embodiment of the invention and related drawings.

DETAILED DESCRIPTION OF THE PREFERRED INVENTION

The assembly of axial components such as resistors in printed circuit boards usually requires that component leads be bent into a form commonly referred to as a staple bend. If the board is a commercial product, good practice dictates that the minimum bend radius be a function of lead diameter. If the board is going to be used in military equipment, the minimum permissable bend radius is usually dictated by the applicable military specification such as MIL-P-46843B. Generally, the minimum radius is a function of lead diameter. The maximum radius is limited by lead spacing and a radius greater than one-half the body diameter will raise the component off of the board and thus more subject to vibration damage, etc.

Figure 1:
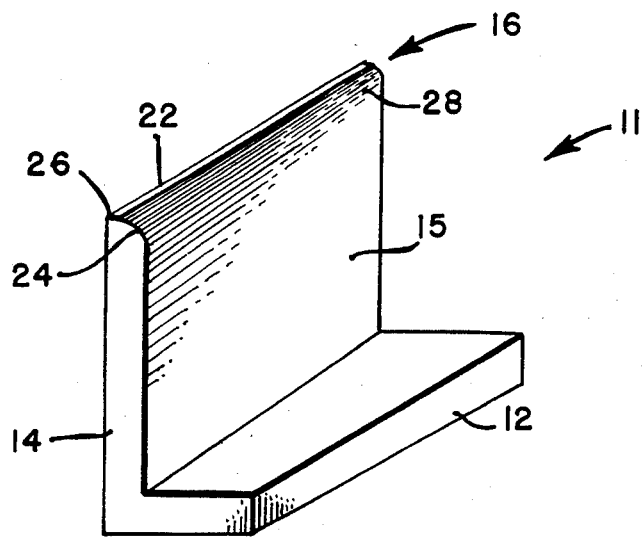
FIG. 1 is a projection view of the die of the present invention.
Figure 2:
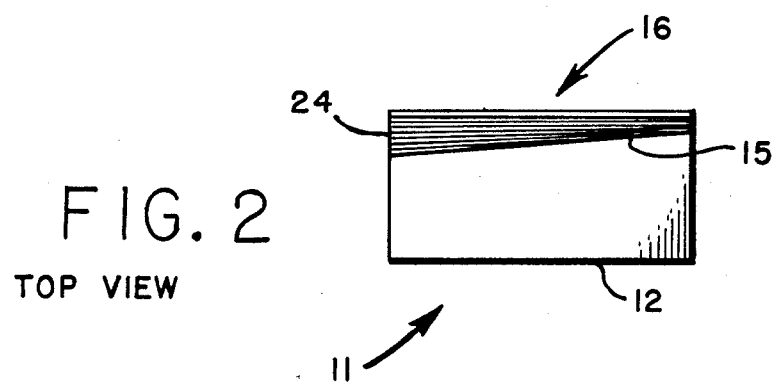
FIG. 2 is a top view of the die.

Referring to FIG. 1, a die 11 is shown in a perspective view. FIG. 2 is a top view of die 11. Die 11 can be made of sufficiently strong material so as to be able to withstand repeated operations. This material can be, preferably, hardened steel or other conventional die materials.

Die 11 is constructed with a base 12, a pedestal 14 attached to base 12, and a contact anvil 16 attached to pedestal 14. In the embodiment shown, die 11 is one piece of metal machined into the desired shape. Base 12 is a rectangular plate that is mounted to a die platform 18, FIG. 4. Pedestal 14 is a wedge shaped rectangular plate that must be of sufficient height where a lead 20, FIG. 4, does not contact base 12 when bent.

Figure 3A:
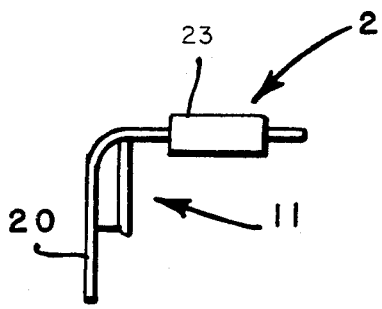
FIGS. 3A and 3B show a resistor being bent over the die of the present invention.
Figure 3B:
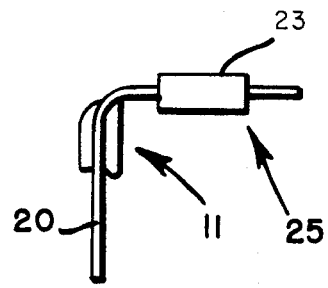

Contact anvil 16 has a flat top stripe 22 which is dictated by the minimum distance between a component body 23 and the start of the bend in lead 20, FIGS. 3A and 3B. Contact anvil 16 includes additionally a bending surface 24 shaped like a quartered conical frustum having the largest radius at end 26 and the smallest radius desired at end 28. The range of radii between ends 26 and 28 should fall within the specification range desired for a particular component. A too steep gradient would cause lead 20 to slide toward the smaller radii when a punch 30, FIGS. 4 and 5, forces lead 20 in the downward direction as shown in FIG. 4.

FIG. 3A shows the position of lead 20 on die 11 when lead 20 is given the largest radius bend. FIG. 3B shows the position of lead 20 when given the smallest radius bend. A radius bend intermediate to the largest and smallest is produced by moving the position of a component 25 along horizontal bending surface 24.

Figure 4:
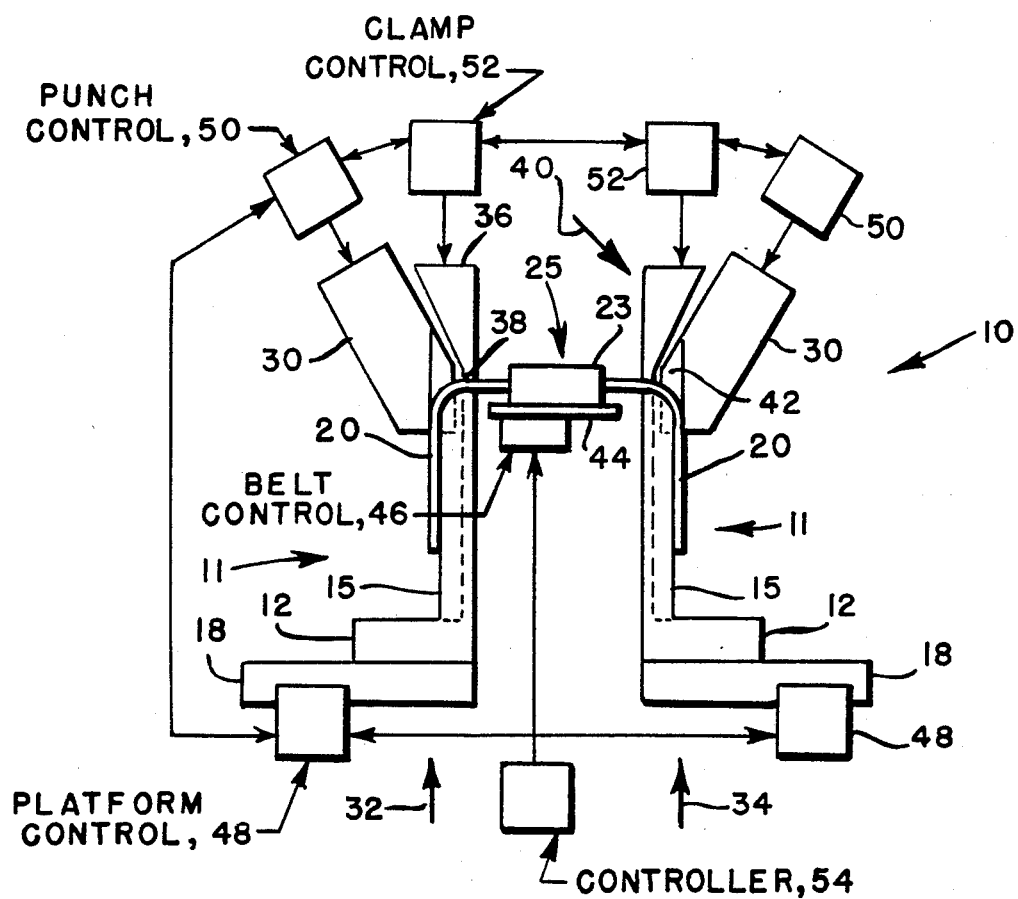
FIG. 4 is a front view of the variable radius lead former of the present invention.

The operation of variable radius lead former 10 is further illustrated in partial schematic in FIG. 4. In order to bend two axial leads 20 attached to body 23 in a similar manner, a left and a right lead former 32 and 34, respectively, are the mirror images of each other.

A clamp 36 is wedge shaped with a flat edge 38 that holds lead 20 against stripe 22 of contact anvil 16 while punch 30 bends lead 20 downward.

Figure 5:
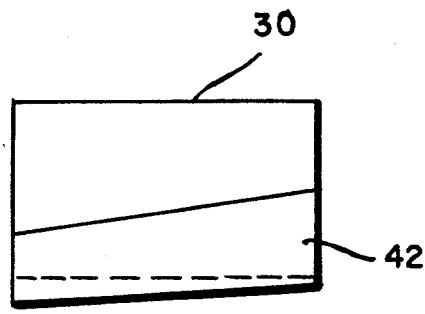
FIG. 5 is a view of a punch used to bend the leads over the die of the present invention.

A side view of punch 30 is shown in FIG. 4 and a special view taken in the direction of arrow 40 is shown in FIG. 5. Die 11, punch 30, and clamp 36 are of equal length. This prevents unnecessary movement of punches 30 and clamps 36 before and after bending.

Punch 30 has a section of material removed so that when punch 30 moves directly downward a surface 42 is in close contact with a wall 15 of pedestal 14. The distance of surface 42 of punch 30 from wall 15 is slightly greater than the diameter of lead 20. This prevents any elongation of lead 20 by punch 30 in the bending process.

In FIG. 4, electrical component 25 such as a resistor is transported into variable radius lead former 10 by a continuous belt 44 with body 23 attached thereon by conventional means. A belt control means 46 determines at what position to stop belt 44 and which thus determines the radius bend of leads 20. Depending upon electrical component 25 on belt 44, belt control means 46 can be programmed accordingly.

Base 12 of die 11 is attached to platform 18 as noted above. A platform control means 48 moves dies 11 in the opposite horizontal direction as determined by the amount of straight lead required off of body 23.

A punch control means 50 and a clamp control means 52 in cooperation with, in particular, belt control means 46 move punches 30 and clamps 36 in response to the movement of belt 44. A controller 54 is connected to belt control means 46, platform control means 48, punch control means 50, and clamp control means 52. Controller 54 is a computer programmed to produce a desired radius bend of a given component 25. The mechanisms that move punch 30, platform 18, and clamp 36 are considered to be within the skill of one in the art to make and are not further discussed.

In operation, belt 44 carries component 25 into former 10 and stops at a desired position along dies 11. Clamps 36 are directly lowered onto leads 20 so that leads 20 are brought to rest on flat surface 22, FIG. 1.

Thereafter, punches 30 are moved inward and downward to bend leads 20 to the desired radius. Punches 30 and clamps 36 are removed in reverse order and component 25 is carried out of former 10. This operation is repeated as necessary with dies 11 being moved when required by the program.

Clearly, many modifications and variations of the present invention are possible in light of the above teachings and it is therefore understood, that within the inventive scope of the inventive concept, the invention may be practiced otherwise than specifically claimed.

What is claimed is:

1. A variable radius lead former, said former bending opposing axial leads of an electronic component in a staple like fashion, said variable radius lead former comprising:

means for bending said axial leads with a selected radius, said means for bending having a pair of die means for receiving said axial leads, each of said die means having a die, said die having a contact anvil upon which said axial lead is bent; a die platform, said die mounted upon said die platform, said die platform able to move in a horizontal direction parallel to said axial leads in a precisely defined manner whereby a position for starting of a radius bend on said axial leads is determined; and a platform control operatively connected to said die platform, said platform control moving said die platform;

said die including a base, said base mounted to said die platform; a pedestal, said pedestal mounted upon said base; and said contact anvil, said contact anvil mounted to said pedestal;

said contact anvil including a flat horizontal stripe upon which said lead rests while bending occurs and a bending surface shaped like a quartered conical frustum, said lead being bent upon said frustum shaped bending surface, said pedestal having a wall, a top surface of said wall congruent with said bending surface shaped like a quartered conical frustum;

means located between said pair of die means for positioning said component between said means for bending whereby said axial leads are bent to have a selected radius, said leads being positioned along said bending surface shaped like a quartered conical frustum; and means operatively connected to said bending means and said positioning means for controlling said means for bending and said means for positioning, said means for controlling being programmed to produce said selected radius.

2. A variable radius lead former as defined in claim 1 wherein said means for bending includes a pair of punches for bending said leads, each of said punches being located adjacent said wall and having a surface closely conforming to said wall of said pedestal upon which said contact anvil is mounted, said lead being bent by said punch and in contact with said surface of said punch and said wall of said pedestal, said surface of said punch forming an acute angle between the perpendicular to said axial leads.

* * * * *